(12) United States Patent  
Zhang et al.

(10) Patent No.: US 7,561,865 B2
(45) Date of Patent: Jul. 14, 2009

(54) SYSTEM AND METHOD FOR DETERMINING A RESONANT FREQUENCY IN A COMMUNICATIONS DEVICE

(75) Inventors: Ligang Zhang, Oceanside, CA (US); Scott D. Willingham, Austin, TX (US); Peter J. Vancorenland, Austin, TX (US); Yunteng Huang, Irvine, CA (US)

(73) Assignee: Silicon Laboratories, Inc., Austin, TX (US)

( * ) Notice: Subject to any disclaimer, the term of this patent is extended or adjusted under 35 U.S.C. 154(b) by 461 days.

(21) Appl. No.: 11/536,900

(22) Filed: Sep. 29, 2006

(65) Prior Publication Data

US 2008/0081583 A1    Apr. 3, 2008

(51) Int. Cl.
*H04B 1/10* (2006.01)

(52) U.S. Cl. .................. 455/307; 455/180.4; 455/184.1

(58) Field of Classification Search .................. 455/120, 455/121, 125, 150.1, 169.1, 179.1, 180.3, 455/180.4, 184.1, 193.1, 226.1, 254, 307
See application file for complete search history.

(56) References Cited

U.S. PATENT DOCUMENTS

| | | | | |
|---|---|---|---|---|
| 4,662,001 A | * | 4/1987 | Cruz et al. | 455/340 |
| 4,956,711 A | * | 9/1990 | Maier | 348/733 |
| 6,453,157 B1 | * | 9/2002 | Roberts | 455/337 |
| 7,187,913 B1 | * | 3/2007 | Rahn et al. | 455/188.1 |
| 7,202,734 B1 | * | 4/2007 | Raab | 330/126 |
| 7,400,868 B2 | * | 7/2008 | Fukusen et al. | 455/150.1 |
| 2003/0017817 A1 | * | 1/2003 | Cowley | 455/323 |
| 2004/0116096 A1 | * | 6/2004 | Shen | 455/323 |
| 2006/0270374 A1 | * | 11/2006 | Lester et al. | 455/307 |
| 2006/0281431 A1 | * | 12/2006 | Isaac et al. | 455/323 |
| 2008/0003970 A1 | * | 1/2008 | Cowley et al. | 455/307 |

* cited by examiner

*Primary Examiner*—Blane J Jackson
(74) *Attorney, Agent, or Firm*—Dicke, Billig & Czaja, PLLC

(57) ABSTRACT

A communications device including communications circuitry, tunable filter circuitry including a node configured to pass a signal between an antenna and the communication circuitry, and control circuitry configured to cause energy in the tunable filter circuitry to be adjusted for a time period and configured to determine a resonant frequency of the tunable filter circuitry from oscillations on the node caused by the energy subsequent to the time period is provided.

26 Claims, 12 Drawing Sheets

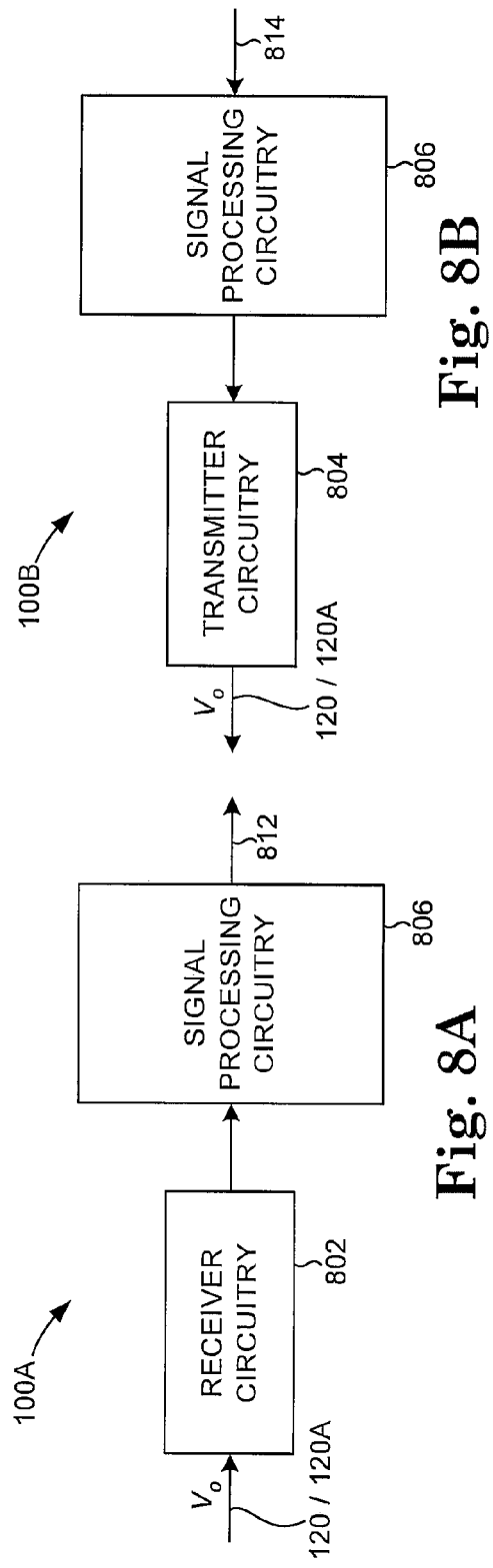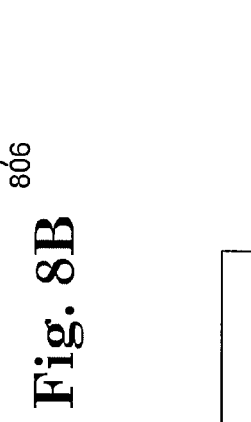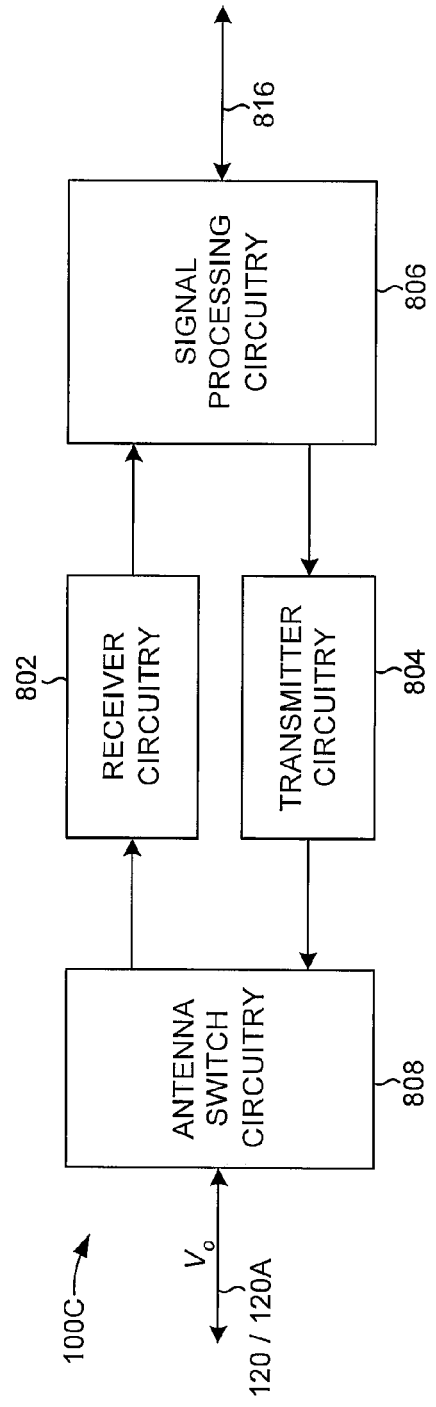
Fig. 8A
Fig. 8B
Fig. 8C

SYSTEM AND METHOD FOR DETERMINING A RESONANT FREQUENCY IN A COMMUNICATIONS DEVICE

BACKGROUND

Radio frequency (RF) communications devices are used in a wide variety of applications such as cellular or mobile telephones, cordless telephones, personal digital assistants (PDAs), computers, radios and other devices that transmit or receive RF signals. As communications devices become increasingly integrated and more portable, the efficiency in transmitting an output signal or receiving an input signal tends to increase in importance. Accordingly, it would be desirable to maximize the signal selectivity and minimize the signal-to-noise ratio of a transmitted or received signal in a communications device.

SUMMARY

According to one exemplary embodiment, a communications device including communications circuitry, tunable filter circuitry including a node configured to pass a signal between an antenna and the communication circuitry, and control circuitry configured to cause energy in the tunable filter circuitry to be adjusted for a time period and configured to determine a resonant frequency of the tunable filter circuitry from oscillations on the node caused by the energy subsequent to the time period is provided.

In another exemplary embodiment, a method performed by an integrated communications device including storing energy in tunable filter circuitry in the device during a time period and determining the resonant frequency of the tunable filter circuitry from oscillations caused by the energy subsequent to the time period is provided.

In further exemplary embodiment, a communications system including a communications device, an antenna coupled to the communications device, and an input/output system configured to communicate with the communications device is provided. The communications device includes communications circuitry, tunable filter circuitry including a node configured to pass a signal between an antenna and the communication circuitry, and control circuitry configured to cause energy to be stored in the tunable filter circuitry for a time period and configured to determine a resonant frequency of the tunable filter circuitry from oscillations on the node caused by the energy subsequent to the time period.

BRIEF DESCRIPTION OF THE DRAWINGS

FIGS. 8A-8C are block diagrams illustrating embodiments of communications circuitry.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As described herein, an integrated low power communications device is provided for use in receiving and/or transmitting radio-frequency (RF) signals or signals from other frequency bands. The communications device is configured to determine a resonant frequency of tunable filter circuitry in the device from oscillations caused by adjusting energy in the tunable filter circuitry for a time period. The measured resonant frequency may be used to adjust the tuning of the tunable filter circuitry to achieve a desired frequency.

The communications devices described herein may be used in a wide variety of integrated communications systems. Although terrestrial RF broadcast communications devices, e.g., FM and AM communications devices, are described herein, these communications devices are presented by way of example. In other embodiments, other broadcast bands may be used.

Figure 1:
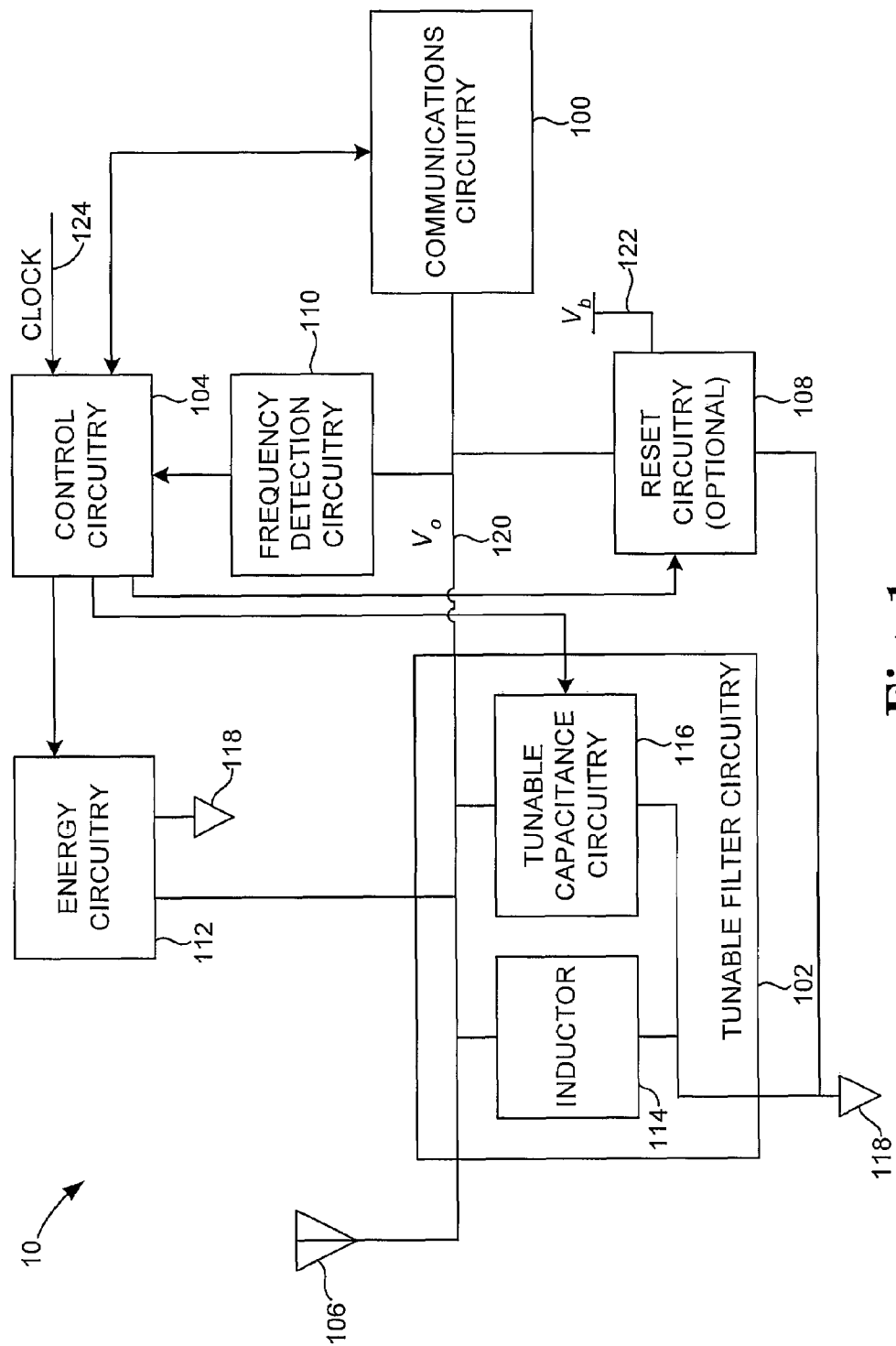
FIG. 1 is a block diagram illustrating one embodiment of a communications device.

FIG. 1 is a block diagram illustrating one embodiment of a communications device 10. Communications device 10 includes communications circuitry 100, tunable filter circuitry 102, control circuitry 104, reset circuitry 108 (optional), frequency detection circuitry 110, and energy circuitry 112.

Communications circuitry 100 includes circuitry configured to transmit and/or receive signals as illustrated in embodiments 100A, 100B, and 100C described below with reference to FIGS. 8A, 8B, and 8C, respectively. The signals may be radio-frequency (RF) signals or signals in another suitable frequency range.

Tunable filter circuitry 102 is configured to be selectively tuned to frequencies associated with signals to be received or transmitted by communications circuitry 100. Tunable filter circuitry 102 includes an inductor 114 and tunable capacitance circuitry 116 that are coupled in parallel between a node 120 and a ground connection 118 where inductor 114 forms an antenna 106 as shown in FIG. 1. Node 120 is configured to pass a signal between antenna 106 and communication circuitry 100.

Control circuitry 104 provides control signals to communications circuitry 100, tunable filter circuitry 102, reset circuitry 108, and energy circuitry 112 to control the operation of communications device 10. Control circuitry 104 also receives feedback signals from at least communications circuitry 100 and frequency detection circuitry 110 for controlling the operation of communications device 10.

To receive or transmit signals, control circuitry 104 causes tunable filter circuitry 102 to be tuned to a desired frequency of signals to be received or transmitted by adjusting tunable capacitance circuitry 116. In a receive mode of operation, signals at the desired frequency are received across antenna 106 on node 120 and provided to communications circuitry 100. In a transmit mode of operation, signals at the desired frequency are generated by communications circuitry 100 on node 120 and transmitted across antenna 106.

Figure 2B:
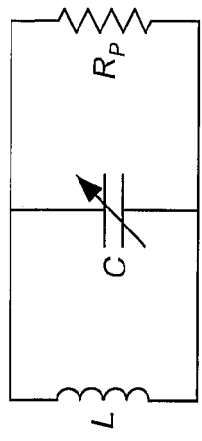
FIGS. 2A-2D are diagrams illustrating one embodiment of tunable filter circuitry models in a communications device.
Figure 2D:
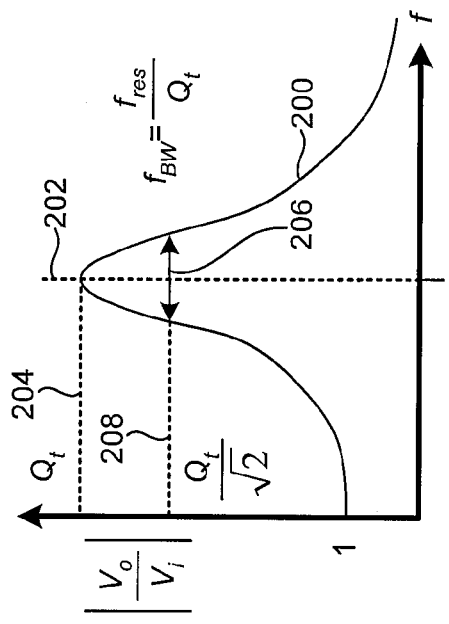
Figure 2A:
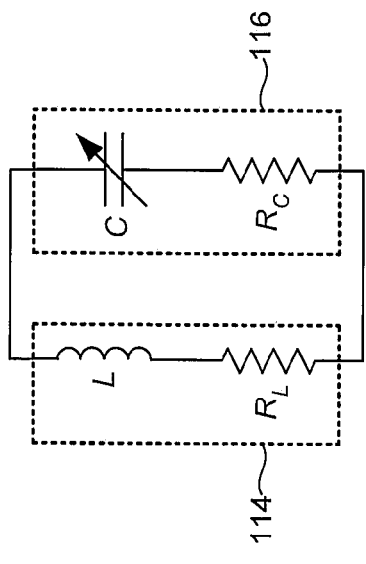

Parallel inductor 114 and tunable capacitance circuitry 116 of tunable filter circuitry 102 form an LC resonant network that functions as a band pass filter as shown in FIG. 2A. Resistances $R_L$ and $R_C$ in FIG. 2A represent the resistances of inductor 114 and tunable capacitance circuitry 116, respectively. The resonant frequency, $f_{res}$, of tunable filter circuitry 102 may be calculated using Equation A where L is the inductance of inductor 114 and C is the capacitance of tunable capacitance circuitry 116.

$$f_{res} = \frac{1}{2\pi\sqrt{LC}} \qquad \text{Equation A}$$

At frequencies near the resonant frequency, the circuit model of FIG. 2A may be approximated by the circuit model of FIG. 2B where a resistance $R_P$ in parallel with inductor 114 and tunable capacitance circuitry 116 replaces resistances $R_L$ and $R_C$. The resistance $R_P$ may be calculated using Equation B where $Q_t$ is the quality factor of tunable filter circuitry 102.

$$R_P = 2\pi f_{res} L Q_t \qquad \text{Equation B}$$

In addition, the quality factor of tunable filter circuitry 102, $Q_t$, relates to the quality factors of inductor 114 and tunable capacitance circuitry 116, $Q_L$ and $Q_C$, respectively, as set forth in Equation C.

$$Q_t = \frac{Q_L Q_C}{Q_L + Q_C} \qquad \text{Equation C}$$

Further, the quality factors of inductor 114 and tunable capacitance circuitry 116, $Q_L$ and $Q_C$, may be calculated using Equations D and E, respectively.

$$Q_L = \frac{2'\pi f_{res} L}{R_L} \qquad \text{Equation D}$$

$$Q_C = \frac{1}{2\pi f_{res} C R_C} \qquad \text{Equation E}$$

Figure 2C:
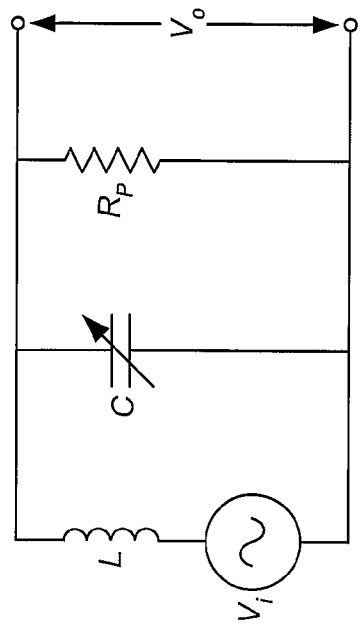

By applying an inductor induced voltage, $V_i$, as shown in FIG. 2C, the transfer function from the inductor induced voltage, $V_i$, to the output voltage, $V_o$, of filter circuitry 102 may be plotted on a graph 200, as shown in FIG. 2D, with frequency along the x-axis and the absolute value of the ratio of output voltage, $V_o$, to the inductor induced voltage, $V_i$, along the y-axis. A dashed line 202 indicates the resonant frequency, $f_{res}$, on the x-axis, and a dashed line 204 indicates the quality factor, $Q_t$, on the y-axis. The bandwidth, $f_{BW}$, 206 at $$\left|\frac{V_o}{V_i}\right| = Q_t / \sqrt{2},$$

indicated by a dashed line 208, may be calculated using Equation F.

$$f_{BW} = \frac{f_{res}}{Q_t} \qquad \text{Equation F}$$

As illustrated by FIG. 2D, a higher quality factor of tunable filter circuitry 102, $Q_t$, results in a higher selectivity and a higher signal-to-noise ratio (SNR) because the output voltage, $V_o$, of filter circuitry 102 is proportional to the quality factor of tunable filter circuitry 102, $Q_t$, and the intrinsic noise of tunable filter circuitry 102 is proportional to $\sqrt{Q_t}$. Thus, for every doubling of the quality factor of tunable filter circuitry 102, $Q_t$, SNR improves by 3 dB. A higher higher quality factor of tunable filter circuitry 102, however, reduces the bandwidth of tunable filter circuitry 102 as indicted by Equation F.

Communications device 10 is configured to determine the resonant frequency, $f_{res}$, of tunable filter circuitry 102 using control circuitry 104, frequency detection circuitry 110, energy circuitry 112, and, in some embodiments, reset circuitry 108. By determining the resonant frequency of tunable filter circuitry 102, communications device 10 may iteratively determine and adjust the resonant frequency of tunable filter circuitry 102 to achieve an optimal tuning of a desired frequency band at a desired frequency of tunable filter circuitry 102.

Tunable filter circuitry 102 tends to dissipate stored energy with predictable damped oscillation or ringing that has a frequency equal to the resonant frequency, $f_{res}$, of tunable filter circuitry 102. Accordingly, communications device 10 determines the resonant frequency using the damped oscillation of energy that is stored in tunable filter circuitry 102 by communications device 10 during a predetermined time period. In one embodiment, communications device 10 compares the damped oscillation of energy from tunable filter circuitry 102 to a known clock frequency to determine the resonant frequency.

Figure 3A:
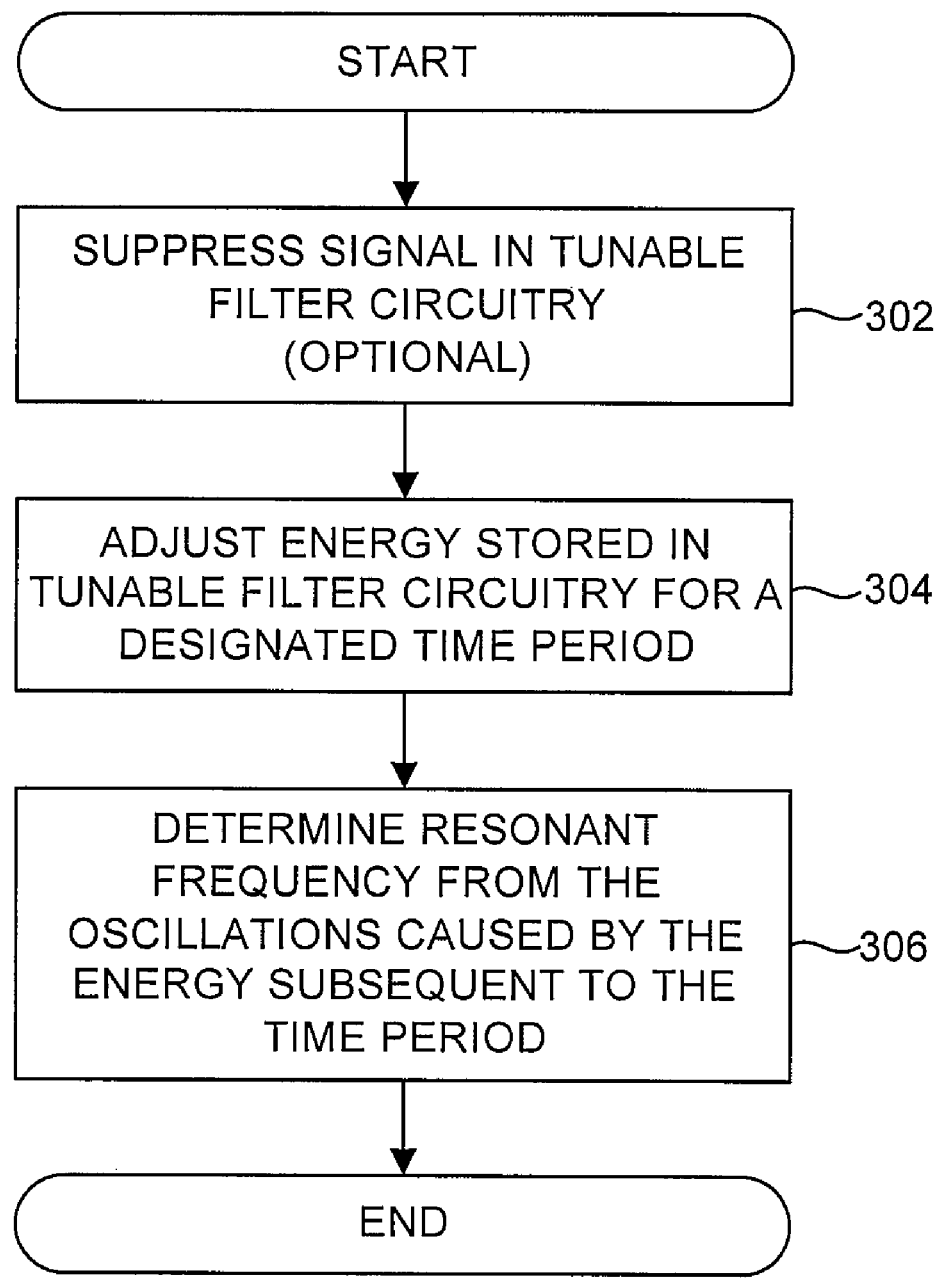
FIGS. 3A-3B are flow charts illustrating embodiments of methods for determining a resonant frequency in a communications device.

FIG. 3A is flow chart illustrating one embodiment of a method for determining the resonant frequency, $f_{res}$, of tunable filter circuitry 102 in communications device 10. The method of FIG. 3A will be described with reference to the embodiment of communications device 10 shown in FIG. 1.

In FIG. 3A, communications device 10 optionally suppresses any signal on node 120 in tunable filter circuitry 102 as indicated in a block 302. In some embodiments, the presence of any large signals on node 120 may affect the accuracy of determining the resonant frequency of tunable filter circuitry 102. Communications device 10 suppresses any signal on node 120 using reset circuitry 108 to prevent any large signals on node 120 from affecting the resonant frequency determination in these embodiments. To do so, control circuitry 104 provides a control signal to reset circuitry 108 to short node 120 to a bias voltage, $V_b$, 122 for a sufficient amount of time to suppress any signal on node 120 in one embodiment. Reset circuitry 108 may include a switch (shown as an embodiment 108A of reset circuitry 108 in FIG. 5) configured to short node 120 to bias voltage 122. In other embodiments, signals on node 120 may be prevented or avoided in any other suitable way to allow the function of block 302 to be omitted.

Subsequent to suppressing the signal (if performed), communications device 10 adjusts energy stored in tunable filter circuitry 102 for a predetermined time period as indicated in a block 304. Communications device 10 adjusts the energy by causing DC energy to be converted to AC energy and stored in inductor 114, tunable capacitance circuitry 116, or both inductor 114 and tunable capacitance circuitry 116 during the time period in one embodiment. In one embodiment, control circuitry 104 provides a control signal to energy circuitry 112 to cause energy from energy circuitry 112 to be adjusted in tunable filter circuitry 102 for the designated time period. Energy circuitry 112 may, for example, include a switch (shown as a transistor M in the embodiment of FIG. 5) configured to short node 120 to a voltage that differs from bias voltage 122 of node 120 to provide energy to tunable filter circuitry 102 in response to a control signal from control circuitry 104. In other embodiments, communications device 10 adjusts the energy stored in tunable filter circuitry 102 in other suitable ways.

Communications device 10 determines the resonant frequency, $f_{res}$, of tunable filter circuitry 102 from the oscillations caused by the energy subsequent to the time period as indicated in a block 306. Subsequent to the time period, the energy stored in tunable filter circuitry 102 dissipates in tunable filter circuitry 102 and forms a damped oscillations or ringing on node 120 where the damped oscillations or ringing have a frequency that is equal to the resonant frequency, $f_{res}$. The energy dissipates over a number of oscillations that is approximately equal to the quality factor, $Q_f$, of tunable filter circuitry 102. Communications device 10 measures the resonant frequency, $f_{res}$, from the damped oscillations caused by the energy stored in tunable circuitry 102. In one embodiment, control circuitry 104 compares the oscillations to a known clock signal 124 to detect the resonant frequency, $f_{res}$. In this embodiment, frequency detection circuitry 110 counts the oscillations on node 120 and provides the count to control circuitry 104. Control circuitry 104 compares the number of oscillations to clock signal 124 to detect the resonant frequency, $f_{res}$. In other embodiments, communications device 10 measures the resonant frequency, $f_{res}$, from the damped oscillations in other suitable ways.

Figure 3B:
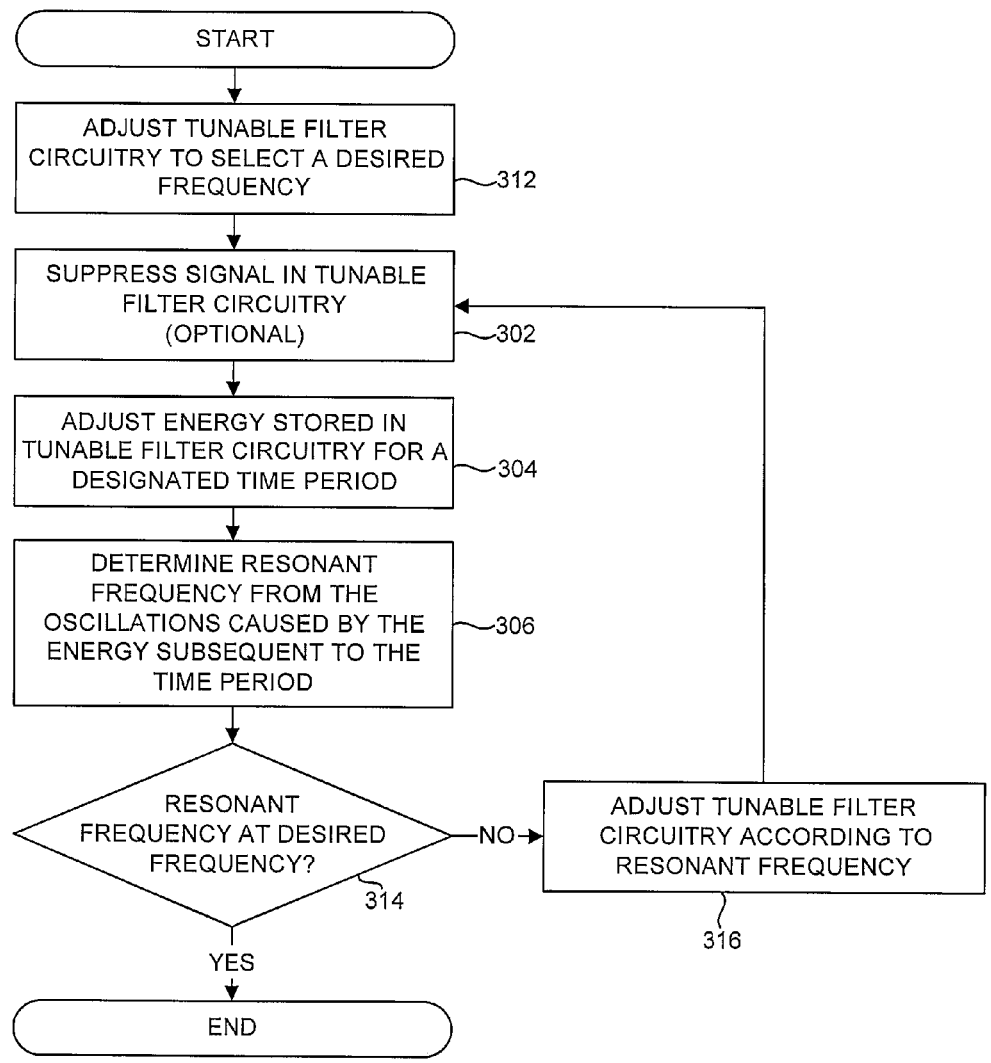

FIG. 3B is flow chart illustrating another embodiment of a method for determining the resonant frequency, $f_{res}$, of tunable filter circuitry 102 in the process of tuning tunable filter circuitry 102 in communications device 10. The method of FIG. 3B will be described with reference to the embodiment of communications device 10 shown in FIG. 1.

In FIG. 3B, control circuitry 104 adjusts tunable filter circuitry 102 to select a desired frequency as indicated in a block 312. Control circuitry 104 adjusts tunable filter circuitry 102 by providing control signals to tunable capacitance circuitry 116 in one embodiment. The desired frequency may be a default or other predetermined frequency or a frequency selected in response to a user input, for example.

Control circuitry 104 optionally causes any signal on node 120 in tunable filter circuitry 102 to be suppressed as indicated in block 302, as described above, and, subsequent to suppressing the signal (if performed), control circuitry 104 causes the energy stored in tunable filter circuitry 102 to be adjusted for a designated time period as indicated in block 304, as described above. Control circuitry 104 determines the resonant frequency, $f_{res}$, of tunable filter circuitry 102 from the oscillations caused by the energy subsequent to the time period as indicated in block 306 as described above.

A determination is made by control circuitry 104 as to whether the resonant frequency, $f_{res}$, is at a desired frequency as indicated in a block 314. If the resonant frequency is at a desired frequency, then control circuitry 104 determines that tunable filter circuitry 102 is tuned to the desired frequency band and the tuning method ends.

The resonant frequency may vary from the desired frequency due to manufacturing process variations or environmental or other operating conditions, for example. If the resonant frequency differs from the desired frequency, then control circuitry 104 adjusts tunable capacitance circuitry 116 according to the detected resonant frequency as indicated in a block 316. Control circuitry 104 adjusts tunable filter circuitry 102 by providing control signals to tunable capacitance circuitry 116 to increase the resonant frequency where the determined resonant frequency was below the desired frequency and decrease the resonant frequency where the determined resonant frequency was above the desired frequency in one embodiment.

Subsequent to adjusting the resonant frequency in block 320, control circuitry 104 iteratively repeats the functions of blocks 302, 304, 306, 314, and 316 until resonant frequency is approximately equal to the desired frequency.

Control circuitry 104A may perform the method of FIG. 3B as part of a calibration process during the manufacturing of communications device 10A or during normal operation of communications device 10A by a user (i.e. subsequent to the manufacturing process). Control circuitry 104 may perform the method of FIG. 3B in response to communications device 10 being powered up or reset, detecting a change in the desired frequency of tunable filter circuitry 102 (e.g., in response a user input indicating a different frequency band), detecting an increase in noise on node 120, detecting a decrease in signal strength on node 120, or any other suitable condition.

In communications device 10, tunable filter circuitry 102, control circuitry 104, reset circuitry 108, frequency detection circuitry 110, and energy circuitry 112 are located on-chip and are at least partially integrated on the same integrated circuit (i.e., on a single chip that is formed on a common substrate) according to one embodiment. Inductor 114 is located off-chip (i.e., external to the common substrate that includes communications device 10). In other embodiments, inductor 114 is included on-chip.

Figure 4B:
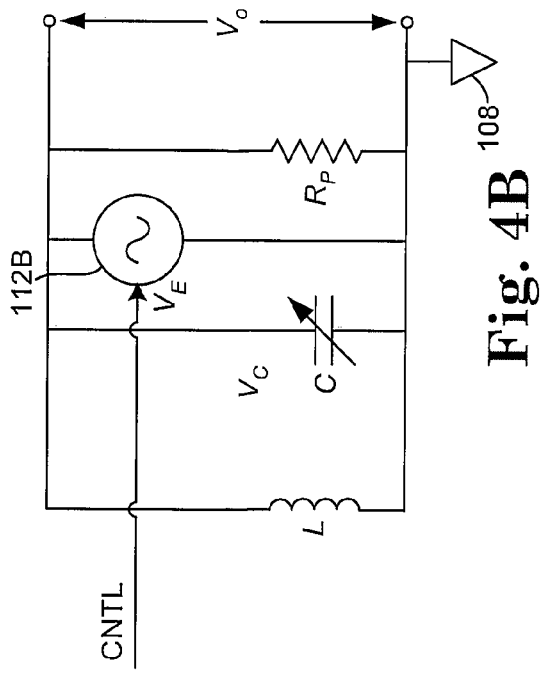
FIGS. 4A-4C are circuit diagrams illustrating embodiments of energy circuitry.

As noted above, communications device 10 adjusts the energy by causing energy to be stored in inductor 114, tunable capacitance circuitry 116, or both inductor 114 and tunable capacitance circuitry 116 during the time period using energy circuitry 112. FIGS. 4A-4B are circuit diagrams illustrating embodiments 112A, 112B, and 112C, respectively of energy circuitry 112 in the circuit model for tunable filter circuitry 102 shown in FIG. 2B.

In FIG. 4A, energy circuitry 112A includes a current source, $I_E$, in series with inductor 114 (represented by inductor L in FIG. 4A) that is configured to be operated in response to a control signal (CNTL) from control circuitry 104. In this embodiment, the energy, $E_L$, stored in tunable filter circuitry 102 may be calculated using Equation G where L is the inductance of the inductor and $I_L$ is the current through the inductor.

$$E_L = L(I_L^2) \qquad \text{Equation G}$$

In FIG. 4B, energy circuitry 112B includes a voltage source, $V_E$, in parallel with tunable capacitance circuitry 116 (represented by a variable capacitor C in FIG. 4B) that is configured to be operated in response to a control signal (CNTL) from control circuitry 104. In this embodiment, the energy, $E_C$, stored in tunable filter circuitry 102 may be calculated using Equation H where C is the capacitance of tunable capacitance circuitry 116 and $V_C$ is the voltage across the variable capacitor.

$$E_C = C(V_C^2) \qquad \text{Equation H}$$

Figure 4C:
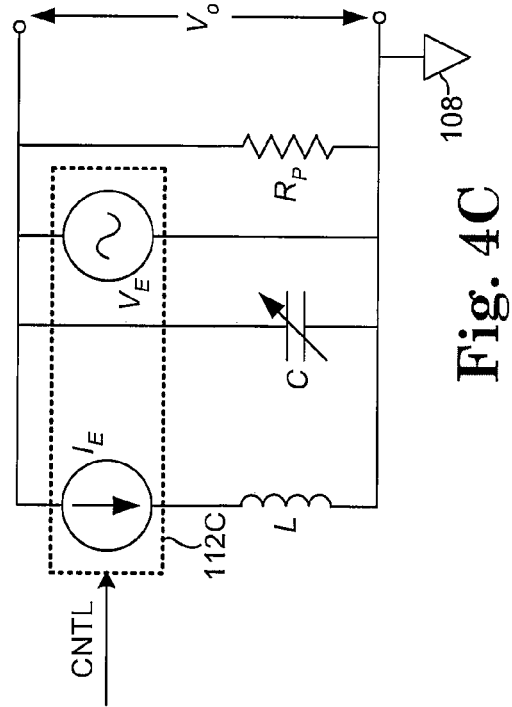
Figure 4A:
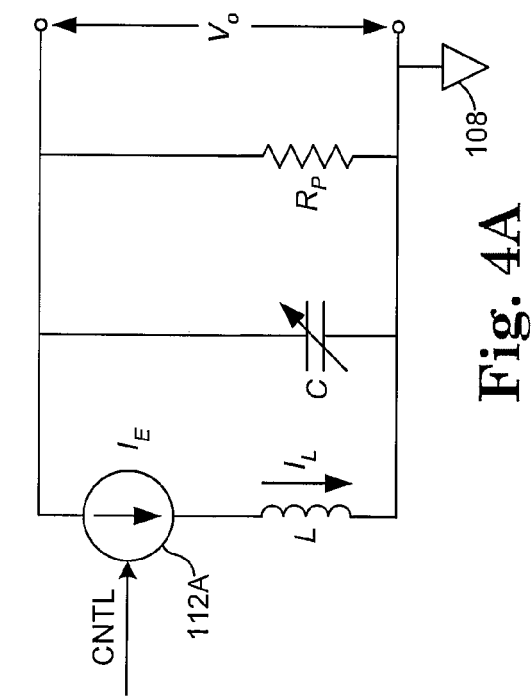

In FIG. 4C, energy circuitry 112B includes both the current source, $I_E$, in series with inductor 114 and the voltage source, $V_E$, in parallel with tunable capacitance circuitry 116. In this embodiment, the energy, $E_{LC}$, stored in tunable filter circuitry 102 may be calculated using Equation I where α and β depend on the phase relationship between $I_L$ and $V_C$.

$$E_{LC} = \alpha L(I_L^2) + \beta C(V_C^2) \qquad \text{Equation I}$$

Figure 5:
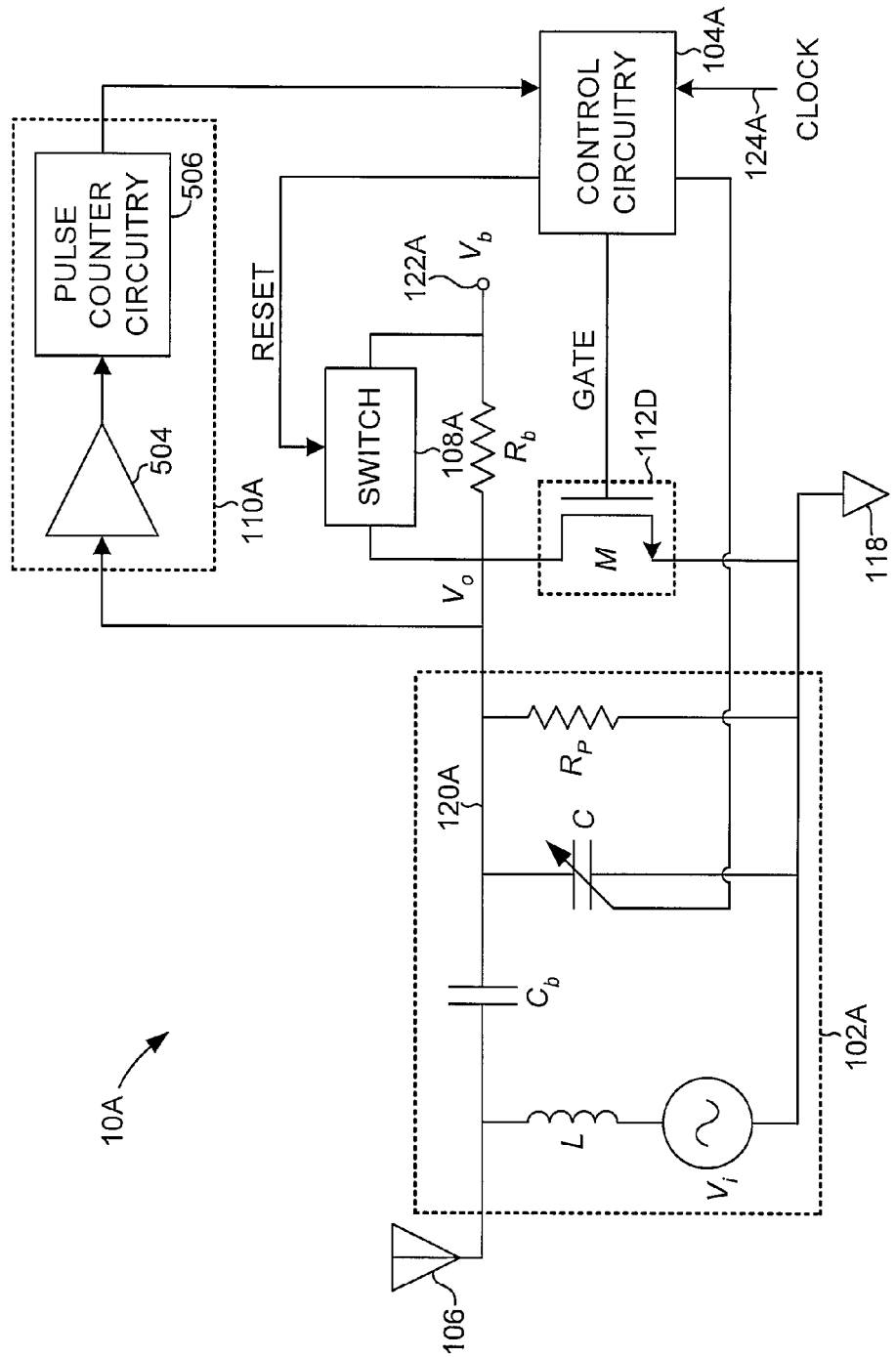
FIG. 5 is a block diagram illustrating one embodiment of selected portions of a communications device.

FIG. 5 is a block diagram illustrating selected portions of an embodiment 10A of communications device 10. Communications device 10A includes an embodiment 102A of tunable filter circuitry 102, an embodiment 104A of control circuitry 104, an embodiment 108A of reset circuitry 108 (i.e., switch 108A), an embodiment 110A of frequency detection circuitry 110, and an embodiment 112D of energy circuitry 112 (i.e., a transistor M 112D). Frequency detection circuitry 110A includes an amplifier 504 and pulse counter circuitry 506.

Tunable filter circuitry 102A includes inductor 114 and tunable capacitance circuitry 116, shown in FIG. 5 using the circuit model of FIG. 2C, coupled in parallel between node 120A and ground connection 118. Parallel inductor 114 and tunable capacitance circuitry 116 of tunable filter circuitry 102A form an LC resonant network that functions as a band pass filter. Tunable filter circuitry 102A also includes a node 120A configured to pass a signal between antenna 106 and communication circuitry 100 (shown in FIG. 1). Tunable filter circuitry 102A further includes a large capacitor, $C_b$, which represents the coupling capacitance of tunable filter circuitry 102A. A bias voltage, $V_b$, 122A provides a bias voltage on node 120A across a large resistor, $R_b$, in one embodiment.

Control circuitry 104A provides a control signal to tune the variable capacitor of tunable capacitance circuitry 116, a reset signal (RESET) to open and close switch 108A between node 120A and bias voltage 122A and a gate signal (GATE) to a gate connection of transistor 112D to operate transistor 112D as a switch between node 120A and ground connection 118. Control circuitry 104A receives a signal from pulse counter circuitry 506.

To allow communications device 10A to receive or transmit signals, control circuitry 104A causes tunable filter circuitry 102 to be tuned to a desired frequency of signals to be received or transmitted by adjusting tunable capacitance circuitry 116. Control circuitry 104A is configured to tune tunable filter circuitry 102A by iteratively adjusting and determining the resonant frequency, $f_{res}$, of tunable filter circuitry 102A until the resonant frequency is equal to a desired frequency with some predetermined error tolerance.

Figure 6:
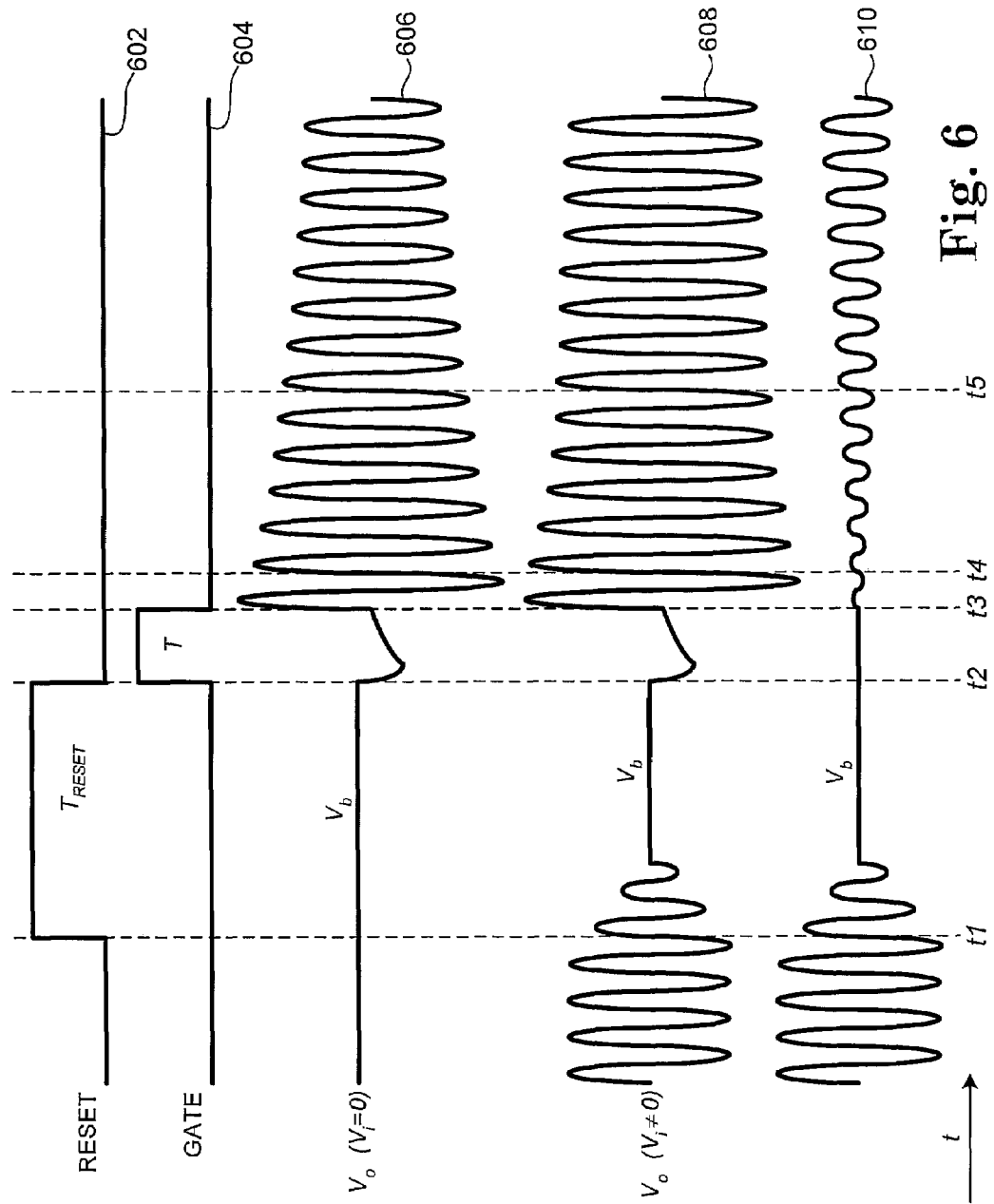
FIG. 6 is a graphical diagram illustrating one embodiment of tuning a communications device.

FIG. 6 is a graphical diagram illustrating one embodiment of tuning communications device 10A. In FIG. 6, a graph 602 illustrates the reset signal provided from control circuitry 104A to switch 108A, a graph 604 illustrates the gate signal provided from control circuitry 104A to transistor 112D, a graph 606 illustrates the voltage of a signal on node 120A where no signal is received across antenna 106 ($V_i$=0), a graph 608 illustrates the voltage of a signal on node 120A where signal is received across antenna 106 ($V_i$≠0), and a graph 610 illustrates the voltage of a signal on node 120A that is received across antenna 106 excluding the damped oscillation part of the waveform.

Referring to FIGS. 5 and 6, control circuitry 104A adjusts tunable filter circuitry 102 to select an initial desired frequency. To do so, control circuitry 104A provides control signals to tunable capacitance circuitry 116 (represented by the variable capacitor C in FIG. 5) to select an amount of capacitance provided by tunable capacitance circuitry 116.

Control circuitry 104A optionally causes any signal on node 120A in tunable filter circuitry 102 to be suppressed. In one embodiment, signal at or near the resonant frequency of tunable filter circuitry 102A may be received across antenna 106 and appear on node 120A as shown in graph 608. For example, the signal may be a large AM or other RF signal whose carrier frequency is equal to or close to the resonant frequency. To prevent this signal from interfering with the determination of the resonant frequency of tunable filter circuitry 102A, control circuitry 104A provides a reset signal to switch 108A to short node 120A to bias voltage 122A for a sufficient amount of time to suppress any signal on node 120. As shown in the example of FIG. 6, control circuitry 104A provides the reset signal to switch 108A from a time t1 to a time t2 to encompass a time period $T_{RESET}$ as shown in graph 602. During time period $T_{RESET}$, the signal on node 120A is suppressed and the voltage on node 120A becomes equal to the bias voltage, $V_b$.

In another embodiment, signals may be prevented from appearing on node 120A using any suitable circuitry (not shown) such that no signal is received across antenna 106 ($V_i$=0) as shown in graph 606. In this embodiment, control circuitry 104A may omit the function of suppressing the signal on node 120A because the voltage on node 120A is already equal to the bias voltage, $V_b$.

Subsequent any unwanted signals being removed from node 120A, control circuitry 104A causes the energy stored in tunable filter circuitry 102A to be adjusted for a designated time period. In the embodiment of FIG. 5, control circuitry 104A provides the gate signal to transistor 112D for a time period T (i.e., from time t2 until a time t3), as shown in graph 604, to activate transistor 112D and short node 120A to ground connection 118. By doing so, control circuitry 104A shorts node 120A to a voltage that differs from the bias voltage on node 120A and causes energy to be stored in tunable filter circuitry 102A.

In one embodiment where time period T is significantly less than the inductance L of inductor 114 divided by the on resistance, $R_M$, of transistor 112D (i.e., T<<(L/$R_M$)) and time period T is significantly greater than the on resistance, $R_M$, times the capacitance C of tunable capacitance circuitry 116 (i.e., T>>($R_M$C)), the current, $I_L$, in inductor 114 after the end of the time period T (i.e., after time t3), ignoring the loss in tunable filter circuitry 102A, may be calculated using Equation J where $\omega_0$ is the resonant frequency.

$$I_L(t) = \left(\frac{V_b}{L}\right)\left(\frac{\sin\omega_0 t}{\omega_0} + T\cos\omega_0 t\right) \qquad \text{Equation J}$$

The energy stored in tunable filter circuitry 102A just after time t3 may be approximated using Equation K where $I_{Lmax}$(t) is the maximum current in inductor 114 after time t3.

$$E_{LC} = L(I_{Lmax}(t))^2 \qquad \text{Equation K}$$

Where the time period T is relatively short (e.g., where T is just long enough to allow the voltage on node 120A to discharge to zero), the maximum current in inductor 114 may be approximated using Equation L.

$$I_{Lmax} = \frac{V_b}{L\omega_0} \qquad \text{Equation L}$$

Where the time period T is relatively long (e.g., where T is long enough to allow the voltage on node 120A to discharge to zero and then recharge to the bias voltage), the maximum current in inductor 114 may be approximated using Equation M.

$$I_{L\max} = \frac{V_b T}{L} \quad \text{Equation M}$$

Where the time period T is relatively moderate, the maximum current in inductor 114 may be approximated using Equation J above at a time $t_{max}$ where $t_{max}$ is derived using Equation N.

$$\tan \omega_0 t_{\max} = \frac{1}{T\omega_0} \quad \text{Equation N}$$

Control circuitry 104A determines the resonant frequency, $f_{res}$, of tunable filter circuitry 102A from the oscillations on node 120A caused by the energy subsequent to the time period T. At time t3, control circuitry 104A deasserts the gate signal as shown in graph 604. As a result, the energy stored in tunable filter circuitry 102A begins to dissipate in a predictable damped oscillation manner between inductor 114 and tunable capacitance circuitry 116 on node 120A as shown in graphs 606 and 608. The number of damped oscillations may be approximately equal to the quality factor, $Q_f$, of tunable filter circuitry 102A.

Amplifier 504 amplifies the oscillations on node 120A and provides the amplified oscillations to pulse counter circuitry 506. Pulse counter circuitry 506 counts the number of amplified oscillations and provides the count to control circuitry 104A. Control circuitry 104A compares the count to a clock signal 124A with a known frequency to determine the resonant frequency, $f_{res}$, of tunable filter circuitry 102A between a time t4 and a time t5. For example, if the resonant frequency, $f_{res}$, is 1 MHz and clock signal 124A is 100 MHz, control circuitry 104A may count the number of cycles of clock signal 124A over five oscillations on node 120A and determine the resonant frequency, $f_{res}$, to an accuracy of +/−0.2%. Because additional circuitry, such as diodes, (not shown) may cause the resonant frequency to vary where overshoot occurs, control circuitry 104A may begin the counting subsequent to time t3 (e.g., at time t4) to avoid counting any overshoot of the first cycle or cycles of oscillation.

If the resonant frequency is equal to the desired frequency, then control circuitry 104A determines that tunable filter circuitry 102A is tuned to the desired frequency band and the tuning method ends.

If the resonant frequency determined by control unit 104A differs from the desired frequency, then control circuitry 104A iteratively adjusts tunable filter circuitry 102A and determines the resonant frequency of tunable filter circuitry 102 as just described until the resonant frequency is equal to the desired frequency. Control circuitry 104A adjusts the resonant frequency of tunable filter circuitry 102A by providing control signals to tunable capacitance circuitry 116 to increase or decrease the amount of capacitance provided by tunable capacitance circuitry 116.

For increased accuracy, control unit 104A may repeat the resonant frequency determination process for a desired frequency to average out any errors that may appear in the process.

Control circuitry 104A may perform the resonant frequency determination process as part of a calibration process during the manufacturing of communications device 10A or during normal operation of communications device 10A by a user (i.e. subsequent to the manufacturing process). Control circuitry 104A may perform the resonant frequency determination process in response to communications device 10A being powered up or reset, detecting a change in the desired frequency of tunable filter circuitry 102A (e.g., in response a user input indicating a different frequency band), detecting an increase in noise on node 120A, detecting a decrease in signal strength on node 120A, detecting that the tuned resonant frequency has moved away from the desired frequency, or any other suitable condition.

To accurately determine the resonant frequency, $f_{res}$, communications device 10A may be configured to cause the initial amplitude of the oscillations on node 120A to be sufficiently large and the quality factor, $Q_f$, of tunable filter circuitry 102A may be set to a maximum value to maximize the number of oscillations on node 120A and ensure that the amplitude of the oscillations remains high for a sufficient number of oscillations. The amplitude may be calculated using Equation O.

$$V_{amp} = \omega_0 L I_{L\,max} \quad \text{Equation O}$$

Where the time period T is relatively short (e.g., where T is just long enough to allow the voltage on node 120A to discharge to zero), the initial amplitude of the oscillations on node 120A may be approximately equal to the bias voltage.

Where the time period T is relatively long (e.g., where T is long enough to allow the voltage on node 120A to discharge to zero and then recharge to the bias voltage), the initial amplitude of the oscillations on node 120A may be estimated using Equation P.

$$V_{amp} = I_L \sqrt{\frac{L}{C}} = \omega_0 V_b T \quad \text{Equation P}$$

Where the time period T is relatively moderate, initial amplitude of the oscillations on node 120A may be estimated using Equation O above.

Accordingly, control circuitry 104A may select T to adjust the initial amplitude of the oscillations on node 120A. In addition, control circuitry 104A may select T such that the term $f_{res}T$ is a constant to yield a constant initial amplitude for all resonant frequencies of tunable filter circuitry 102A.

Because of the damped oscillation function of the oscillations on node 120A, control circuitry 104A may initiate the counting of the oscillations on node 120A soon after the damped oscillations begins (e.g., soon after t3 in the example of FIG. 6). In addition, control circuitry 104A may finish the counting of the oscillations within a low number of oscillations on node 120A to ensure that the amplitude of the oscillations is sufficiently large.

In embodiments where no signal is received across antenna 106 ($V_i=0$) during the resonant frequency determination process, outside signals may not interfere with the oscillations caused by the stored energy in tunable filter circuitry 102A and the oscillations may appear as shown in graph 606.

In embodiments where signal is received across antenna 106 during the resonant frequency determination process, the signal may begin to be received and build in tunable filter circuitry 102A subsequent to the time period T (i.e., after time t3) where energy is stored in tunable filter circuitry 102A as shown in graph 610. The signal may start to build with a time constant of $2Q_f/(2\pi f_{res})$. As illustrated in graph 608, the received signal combines with the oscillations caused by the stored energy on node 120A. Accordingly, control circuitry 104A is configured to complete the resonant frequency determination process soon after the damped oscillations begin to prevent any received signal from getting big enough to interfere with the process.

In communications device 10A, tunable filter circuitry 102A, control circuitry 104A, switch 108A, frequency detection circuitry 110A, and transistor 112D are located on-chip and are at least partially integrated on the same integrated circuit (i.e., on a single chip that is formed on a common substrate) according to one embodiment. Inductor 114 is located off-chip (i.e., external to the common substrate that includes communications device 10). In other embodiments, inductor 114 is included on-chip. In either location, inductor 114 may form antenna 106.

As used herein, an RF signal means an electrical signal conveying useful information and having a frequency from about 3 kilohertz (kHz) to thousands of gigahertz (GHz), regardless of the medium through which the signal is conveyed. Thus, an RF signal may be transmitted through air, free space, coaxial cable, and/or fiber optic cable, for example.

For purposes of illustration, the output signals of communications devices 10 and 10A described herein may be transmitted in signal bands such as AM audio broadcast bands, FM audio broadcast bands, television audio broadcast bands, weather channel bands, or other desired broadcast bands. The following table provides example frequencies and uses for various broadcast bands that may be transmitted by communications devices 10 and 10A.

TABLE 1

EXAMPLE FREQUENCY BANDS AND USES

| FREQUENCY | | USES/SERVICES |
|---|---|---|
| 150-535 | kHz | European LW radio broadcast |
| | | 9 kHz spacing |
| 535-1700 | kHz | MW/AM radio broadcast |
| | | U.S. uses 10 kHz spacing |
| | | Europe uses 9 kHz spacing |
| 1.7-30 | MHz | SW/HF international radio broadcasting |
| 46-49 | MHz | Cordless phones, baby monitors, remote control |
| 59.75 (2) | MHz | U.S. television channels 2-6 (VHF_L) |
| 65.75 (3) | MHz | 6 MHz channels at 54, 60, 66, 76, 82 |
| 71.75 (4) | MHz | Audio carrier is at 5.75 MHz (FM MTS) |
| 81.75 (5) | MHz | |
| 87.75 (6) | MHz | |
| 47-54 (E2) | MHz | European television |
| 54-61 (E3) | MHz | 7 MHz channels, FM sound |
| 61-68 (E4) | MHz | Band I: E2-E4 |
| 174-181 (E5) | MHz | Band II: E5-E12 |
| 181-188 (E6) | MHz | |
| 188-195 (E7) | MHz | |
| 195-202 (E8) | MHz | |
| 202-209 (E9) | MHz | |
| 209-216 (E10) | MHz | |
| 216-223 (E11) | MHz | |
| 223-230 (E12) | MHz | |
| 76-91 | MHz | Japan FM broadcast band |
| 87.9-108 | MHz | U.S./Europe FM broadcast band |
| | | 200 kHz spacing (U.S.) |
| | | 100 kHz spacing (Europe) |
| 162.550 (WX1) | MHz | U.S. Weather Band |
| 162.400 (WX2) | MHz | 7 channels, 25 kHz spacing |
| 162.475 (WX3) | MHz | SAME: Specific Area Message Encoding |
| 162.425 (WX4) | MHz | |
| 162.450 (WX5) | MHz | |
| 162.500 (WX6) | MHz | |
| 162.525 (WX7) | MHz | |
| 179.75 (7) | MHz | U.S. television channels 7-13 (VHF_High) |
| | | 6 MHz channels at 174, 180, 186, 192, 198, 204, 210 |
| 215.75 (13) | MHz | FM Sound at 5.75 MHz |
| 182.5 (F5) | MHz | French television F5-F10 Band III |
| | | 8 MHz channels |
| 224.5 (F10) | MHz | Vision at 176, 184, 192, 200, 208, 216 MHz |
| | | AM sound at +6.5 MHz |

TABLE 1-continued

EXAMPLE FREQUENCY BANDS AND USES

| FREQUENCY | | USES/SERVICES |
|---|---|---|
| 470-478 (21) | MHz | Band IV - television broadcasting |
| | | Band V - television broadcasting |
| 854-862 (69) | MHz | 6 MHz channels from 470 to 862 MHz |
| | | U.K. System I (PAL): |
| | | Offsets of +/−25 kHz may be used to alleviate co-channel interference |
| | | AM Vision carrier at +1.25 (Lower Sideband vestigial) |
| | | FMW Sound carrier at +7.25 |
| | | Nicam digital sound at +7.802 |
| | | French System L (Secam): |
| | | Offsets of +/−37.5 kHz may be used |
| | | AM Vision carrier at +1.25 (inverted video) |
| | | FMW Sound carrier at +7.75 |
| | | Nicam digital sound at +7.55 |
| 470-476 (14) | MHz | U.S. television channels 14-69 |
| | | 6 MHz channels |
| 819-825 (69) | MHz | Sound carrier is at 5.75 MHz (FM MTS) |
| | | 14-20 shared with law enforcement |

Figure 7:
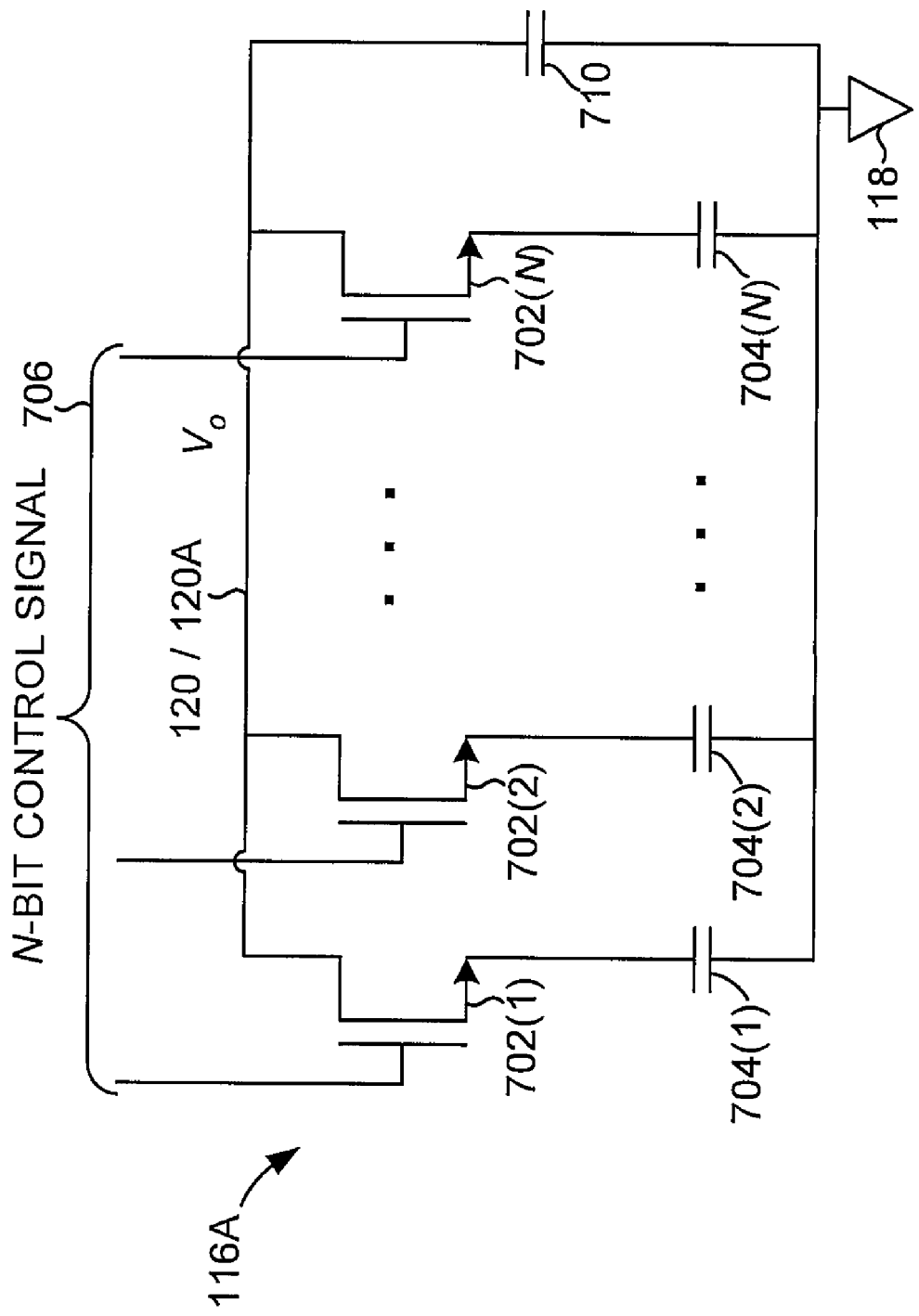
FIG. 7 is a circuit diagram illustrating one embodiment of tunable capacitance circuitry.

FIG. 7 is a circuit diagram illustrating an embodiment 116A of tunable capacitance circuitry 116. In FIG. 7, tunable capacitance circuit 116A includes a plurality of individual capacitance circuits connected in parallel between node 120 (FIG. 1) or 120A (FIG. 5) and ground connection 118. Each individual capacitance circuit includes a transistor 702 and a capacitor 704. For example, transistor 702(1) and capacitor 704(1) make up a first capacitance circuit. Transistor 702(2) and capacitor 704(2) make up a second capacitance circuit. And transistor 702(N) and capacitor 704(N) make up an Nth capacitance circuit where N is an integer greater than or equal to two. An N-bit digital control signal 706 from control circuitry 104 (shown in FIG. 1) or control circuitry 104A (shown in FIG. 5) provides a control signal to each of the N individual capacitance circuit. These control signals are coupled to the gate nodes of the respective transistors 702(1)-702(N). In operation, depending upon the state of each bit of the N-bit control signal 706, capacitors 704(1)-704(N) are individually switched into the LC filter circuit of tunable filter circuitry 102 (shown in FIG. 1) or tunable filter circuitry 102A (shown in FIG. 5) or excluded from the LC filter circuit. In other words, each of the capacitors 704(1)-704(N) can be individually included in or excluded the overall capacitance for the tunable capacitance circuit 116A.

Capacitors 704(1)-704(N) may be weighted in such a way as to facilitate the tuning of the tunable capacitance circuit 116A. Possible weighting schemes for these capacitors 704(1)-704(N) include identical weights (x, x, x, etc.), geometric weighted (2x, 4x, 8x, etc.), or any other desired weighting scheme. In one embodiment, capacitor 710 may represent the parasitic capacitances from transistors 702 and/or capacitors 704. In other embodiments, capacitor 710 may represent one or more on-chip and/or external capacitors that may be coupled in parallel between signal line node 120 or 120A and ground connection 118 such that these capacitors are always included within the capacitance of the LC filter circuit. In addition, other on-chip or off-chip variable capacitances, such as varactor diodes or MOS capacitors, may also be utilized to provide a variable capacitance, and capacitance circuits with analog or variable control signals may also be utilized. Examples of a variable capacitance circuitry, including such circuitry that is tunable both through the use of a multiple-bit digital control signal and a plurality of analog control signals, is described in U.S. Pat. No. 6,760,575, which is hereby incorporated by reference in its entirety. In other embodiments, other variable or tunable capacitance circuits and associated control signals may be utilized.

FIGS. 8A-8C are block diagrams illustrating embodiments 100A, 100B, and 110C of communications circuitry 100.

In FIG. 8A, communications circuitry 100A includes receiver circuitry 802 and signal processing circuitry 806. Receiver circuitry 802 couples to node 120 (FIG. 1) or 120A (FIG. 5). Receiver circuitry 802 is configured to receive analog signals, such as analog RF signals, from node 120 or 120A and provide the received signals in a suitable form (e.g., in a digital form) to signal processing circuitry 806. Signal processing circuitry 806 performs any suitable processing on the RF signals and generates an output signal 812. In one embodiment, output signal 812 forms a baseband output signal.

In FIG. 8B, communications circuitry 100B includes transmitter circuitry 804 and signal processing circuitry 806. Transmitter circuitry 804 couples to node 120 (FIG. 1) or 120A (FIG. 5). Signal processing circuitry 806 receives an input signal 814 (e.g., a baseband input signal in one embodiment), performs any suitable processing on input signal 814, and provides the processed input signal 814 in a suitable form (e.g., an analog signal) to transmitter circuitry 804. Transmitter circuitry 804 is configured to transmit the signals received from signal processing circuitry 806 on node 120 or 120A.

In FIG. 8C, communications circuitry 100C includes receiver circuitry 802, transmitter circuitry 804, signal processing circuitry 806, and antenna switch circuitry 808. Antenna switch circuitry 808 couples to node 120 (FIG. 1) or 120A (FIG. 5) and operates to couple node 120 or 120A to either receiver circuitry 802 in a receive mode of operation or transmitter circuitry 804 in a transmit mode of operation. In the receive mode of operation, receiver circuitry 802 and signal processing circuitry 806 operate as described above with reference to FIG. 8A. In the transmit mode of operation, transmitter circuitry 804 and signal processing circuitry 806 operate as described above with reference to FIG. 8B.

Figure 9:
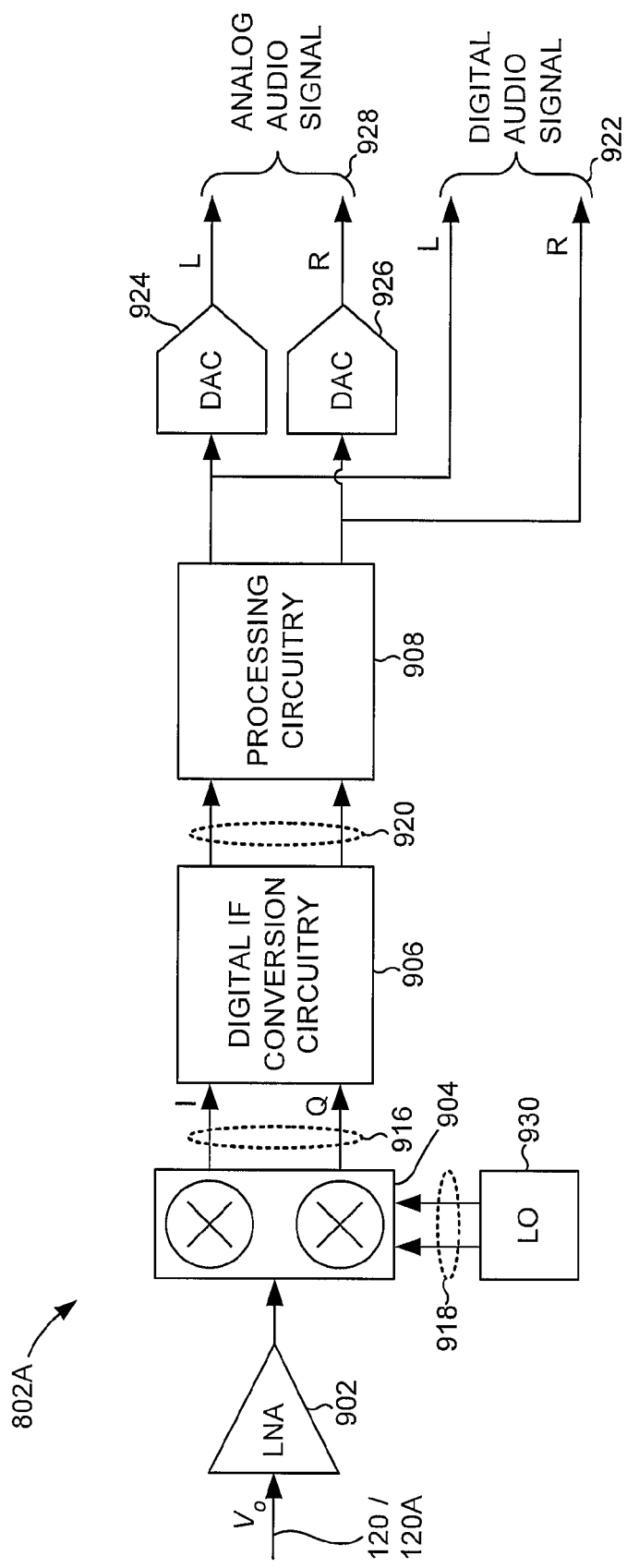
FIG. 9 is a block diagram illustrating one embodiment of selected portions of receiver circuitry.

FIG. 9 is a block diagram illustrating one embodiment 802A of selected portions of receiver circuitry 802. In the embodiment of FIG. 9, receiver circuitry 802A is configured to receive an analog RF input signal, $V_o$, on node 120 (shown in FIG. 1) or node 120A (shown in FIG. 5).

A low noise amplifier (LNA) 902 couples to node 120 or 120A and receives the analog input signal. The output of LNA 902 is then applied to mixer 904, and mixer 904 generates real (I) and imaginary (Q) output signals, as represented by signals 916. To generate these low-IF signals 916, mixer 904 uses phase shifted local oscillator (LO) mixing signals 918. LO generation circuitry 930 includes oscillation circuitry (not shown) and outputs two out-of-phase LO mixing signals 918 that are used by mixer 904. The outputs of mixer 904 are at a low-IF, which can be designed to be fixed or may be designed to vary, for example, if discrete step tuning is implemented for the LO generation circuitry 930. An example of large step LO generation circuitry that utilizes discrete tuning steps is described in the co-owned and co-pending U.S. patent application Ser. No. 10/412,963, which was filed Apr. 14, 2003, which is entitled "RECEIVER ARCHITECTURES UTILIZING COARSE ANALOG TUNING AND ASSOCIATED METHODS," and which is hereby incorporated by reference in its entirety.

Digital IF conversion circuitry 906 receives the real (I) and imaginary (Q) signals 916 and outputs real and imaginary digital signals, as represented by signals 920. Digital IF conversion circuitry 906 preferably includes band-pass or low-pass analog-to-digital converter (ADC) circuitry that converts the low-IF input signals to the digital domain. Digital IF conversion circuitry 906 provides, in part, analog-to-digital conversion, signal gain and signal filtering functions. Digital IF conversion circuitry 906 provides signals 920 to processing circuitry 908.

Processing circuitry 908 performs digital filtering and digital signal processing to further tune and extract the signal information from digital signals 920. Processing circuitry 908 produces baseband digital audio output signals 922. When the input signals relate to FM broadcasts, the digital processing provided by processing circuitry 908 may include, for example, FM demodulation and stereo decoding. Digital output signals 922 may include left (L) and right (R) digital audio output channels that represent the content of the FM broadcast channel being tuned. Processing circuitry 908 also provides the left and right digital audio output channels of signals 922 to digital-to-analog converters (DACs) 924 and 926, respectively.

DACs 924 and 926 receive the left and right digital audio output channels of signals 922, respectively, and convert digital signals 922 to analog audio output signals 928 with left and right analog audio output channels.

In other embodiments, the output of the receiver 802A may be other desired signals, including, for example, low-IF quadrature I/Q signals from an analog-to-digital converter that are passed through a decimation filter, a baseband signal that has not yet be demodulated, multiplexed L+R and L−R audio signals, and/or any other desired output signals.

As used herein, digital IF conversion circuitry refers to circuitry that in part mixes the target channel within the input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low IF frequency for FM broadcasts within the United States would be an IF frequency equal to or below about 600 kHz. It is further noted that for spectrums with non-uniform channel spacings, a low IF frequency would be equal to or below about three steps in the channel tuning resolution of the receiver circuitry. For example, if the receiver circuitry were configured to tune channels that are at least about 100 kHz apart, a low IF frequency would be equal to or below about 300 kHz. As noted above, the IF frequency may be fixed at a particular frequency or may vary within a low IF range of frequencies, depending upon the LO generation circuitry 930 utilized and how it is controlled.

Figure 10:
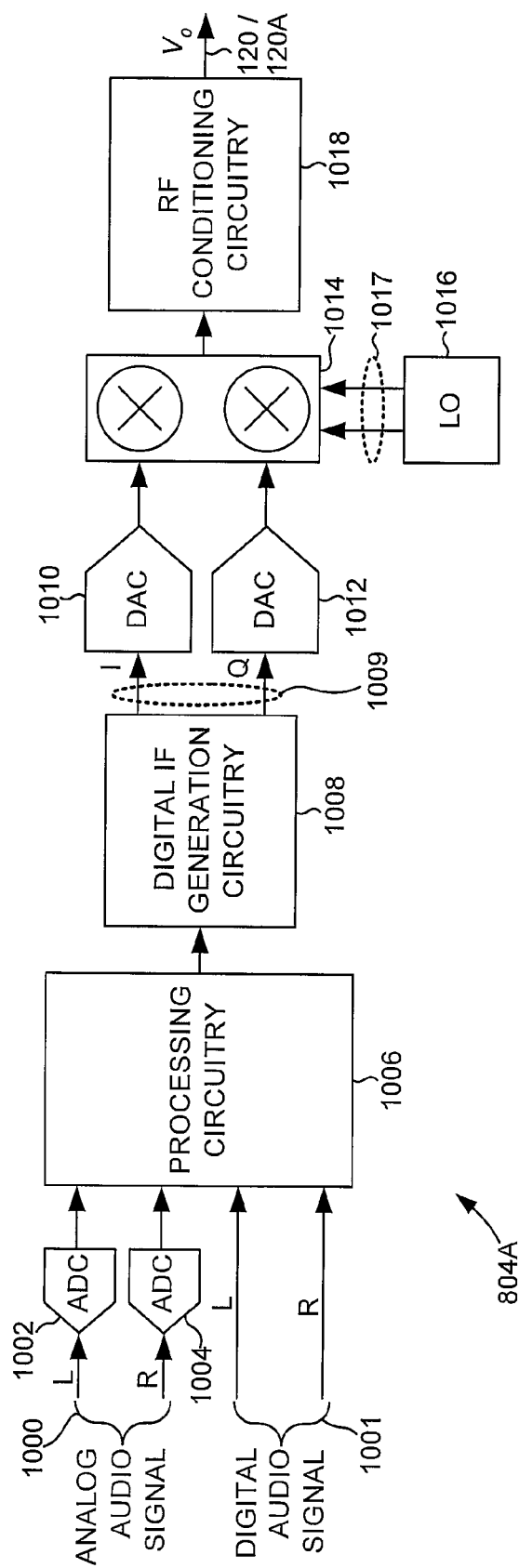
FIG. 10 is a block diagram illustrating one embodiment of selected portions of transmitter circuitry.

FIG. 10 is a block diagram illustrating one embodiment 804A of selected portions of transmitter circuitry 804. In the embodiment of FIG. 10, transmitter circuitry 804A is configured to receive an analog audio signal 1000 and a digital audio signal 1001, each with left (L) and right (R) audio input channels.

Analog-to-digital converters (ADC) 1002 and 1004 receive the left and right audio input channels of the analog audio signal, respectively. ADCs 1002 and 1004 convert the analog audio input channels to first and second sets N bit digital signals, respectively, and provide the sets of N bit digital signals to processing circuitry 1006.

Processing circuitry 1006 receives the sets of N bit digital signals from ADCs 1002 and 1004, respectively, and the digital audio signal 1001. Processing circuitry 1006 also receives the left and right audio input channels of the digital audio signal. Processing circuitry 1006 performs any suitable audio processing on a selected one of the analog and digital signals such as signal conditioning (e.g., tone, amplitude, or compression) and stereo encoding for FM broadcast. Processing circuitry 1006 provides the processed signals to digital intermediate frequency (IF) generation circuitry 1008.

Digital IF generation circuitry 1008 receives the processed signals from processing circuitry 406. Digital IF generation circuitry 1008 upconverts the processed signals to an intermediate frequency and provides the upconverted signals to digital-to-analog converters (DAC) 1010 and 1012. In the embodiment of FIG. 10, digital IF generation circuitry 1008 upconverts the processed signals to produce a quadrature output with real (I) and imaginary (Q) signals, as represented by signals 1009. Digital IF generation circuitry 1008 provides the real signals to DAC 1010 and the imaginary signals to DAC 1012. In other embodiments, digital IF generation circuitry 1008 upconverts the processed signals to produce other signal types.

DACs 1010 and 1012 receive the upconverted signals from digital IF generation circuitry 1008 and convert the digital upconverted signals to analog signals. DACs 1010 and 1012 provide the analog signals to mixer 1014.

Mixer 1014 receives the analog signals from DACs 1010 and 1012. Mixer 1014 upconverts the analog signals to a desired output (transmit) frequency by combining the analog signals with phase shifted local oscillator (LO) mixing signals provided by local oscillator (LO) generation circuitry 1016. LO generation circuitry 1016 includes oscillation circuitry (not shown) and outputs two out-of-phase LO mixing signals 1017 that are used by mixer 1014. The outputs of mixer 1014 are at a low-IF, which can be designed to be fixed or may be designed to vary, for example, if discrete step tuning is implemented for the LO generation circuitry 1016 similarly to LO generation circuitry 930 described above. Mixer 1014 also combines the real and imaginary signals such that the RF signal forms a real RF signal. Mixer 1014 provides the signal to conditioning circuitry 1018.

RF conditioning circuitry 1018 receives the RF signal from RF mixer 1014. RF conditioning circuitry 1018 may filter the RF signal to remove undesired signals and adjust a signal level, i.e. amplitude, of the RF signal to a desired level. RF conditioning circuitry 1018 provides the adjusted RF voltage signal, $V_o$, on node 120 (shown in FIG. 1) or node 120A (shown in FIG. 5) for transmission across antenna 106 (shown in FIG. 1).

In other embodiments, transmitter circuitry 804A may include any other suitable types and arrangements of circuitry configured to generate an RF voltage signal. For example, digital IF generation circuitry 1008 may be omitted in other embodiments.

Figure 11:
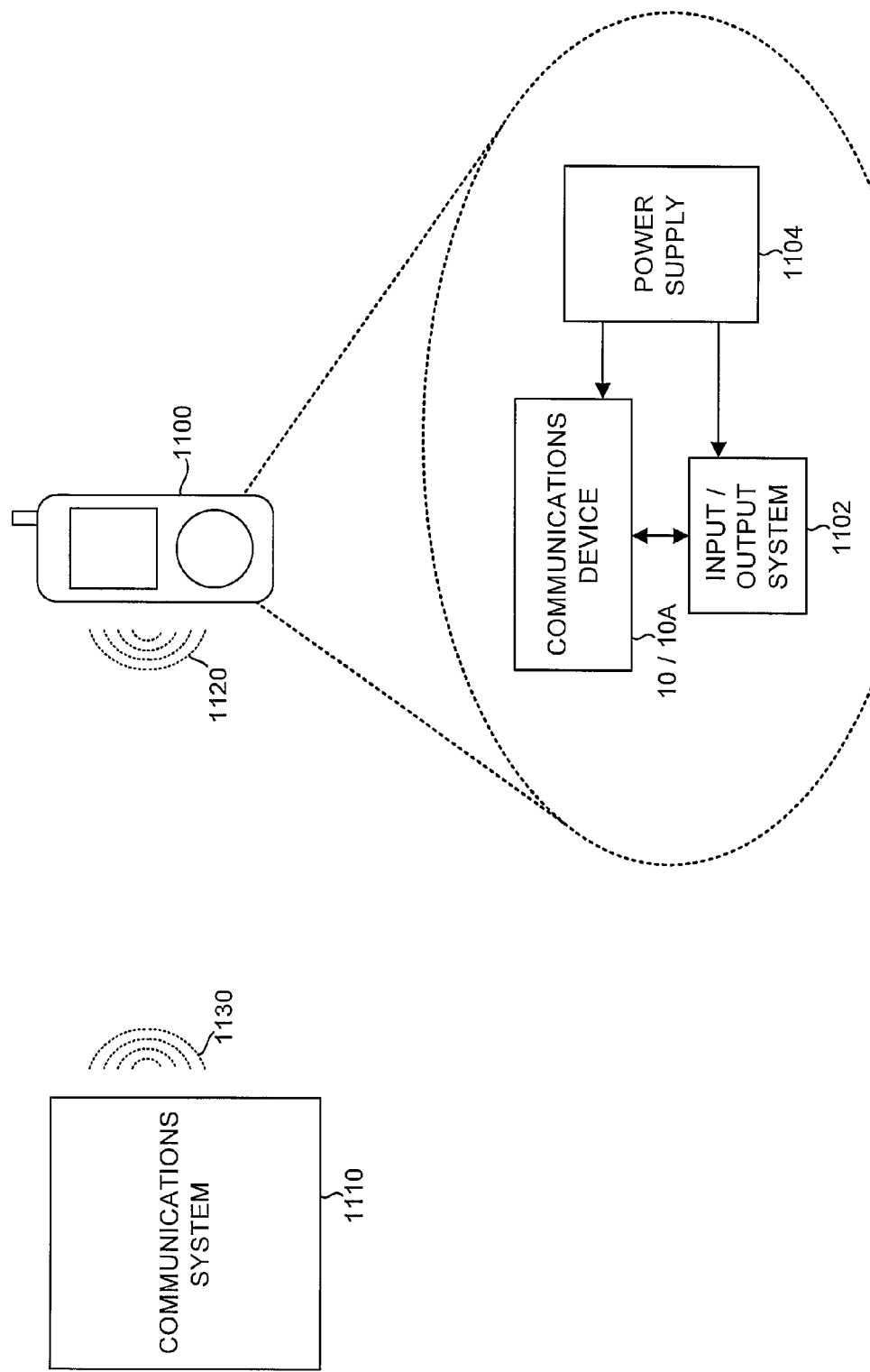
FIG. 11 is a block diagram illustrating one embodiment of a communications system that includes a communications device.

FIG. 11 is a block diagram illustrating one embodiment of a portable communications system 1100 that includes communications device 10 as shown in FIG. 1 or communications device 10A as shown in FIG. 5. Portable communications system 1100 may be any type of portable or mobile communications device such as a mobile or cellular telephone, a personal digital assistant (PDA), an audio and/or video player (e.g., an MP3 or DVD player), a wireless telephone, and a notebook or laptop computer. Portable communications system 1100 includes communications device 10 (FIG. 1) or 10A (FIG. 5), an input/output system 1102, and a power supply 1104, among other components.

Input/output system 1102 receives information from a user and provides the information to communications device 10 or 10A. Input/output system 1102 also receives information from mobile communications device 10 or 10A and provides the information to a user. The information may include voice and/or data communications, audio, video, image, or other graphical information. Input/output system 1102 includes any number and types of input and/or output devices to allow a user provide information to and receive information from portable communications system 1100. Examples of input and output devices include a microphone, a speaker, a keypad, a pointing or selecting device, and a display device.

Power supply 1104 provides power to portable communications system 1100 and input/output system 1102. Power supply 1104 includes any suitable portable or non-portable power supply such as a battery or an AC plug.

Communications device 1000 communicates with receiver 1110 or other remotely located hosts in radio frequencies. Communications device 1000 may transmit information to receiver 1110 or other remotely located hosts in radio frequencies as indicated by a signal 1120. Communications device 1000 may also receive information from receiver 1110 or other remotely located hosts in radio frequencies as indicated by a signal 1130. In other embodiments, communications device 1000 communicates with receiver 1110 or one or more remotely located hosts using other suitable frequency bands.

In the above embodiments, a variety of circuit and process technologies and materials may be used to implement the communications systems according to the invention. Examples of such technologies include metal oxide semiconductor (MOS), p-type MOS (PMOS), n-type MOS (NMOS), complementary MOS (CMOS), silicon-germanium (SiGe), gallium-arsenide (GaAs), silicon-on-insulator (SOI), bipolar junction transistors (BJTs), and a combination of BJTs and CMOS (BiCMOS).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A communications device comprising:
    communications circuitry;
    tunable filter circuitry including a node configured to pass a signal between an antenna and the communication circuitry; and
    control circuitry configured to cause energy in the tunable filter circuitry to be adjusted for a time period and configured to determine a resonant frequency of the tunable filter circuitry from oscillations on the node caused by the energy subsequent to the time period.

2. The communications device of claim 1 further comprising:
    energy circuitry coupled to the node;
    wherein the control circuitry is configured to provide a control signal to the energy circuitry cause the energy to be adjusted.

3. The communications device of claim 2 wherein the energy circuitry includes a switch configured to short the node to ground in response to the control signal.

4. The communications device of claim 1 further comprising:
    reset circuitry coupled to the node;
    wherein the control circuitry is configured to provide a control signal to the reset circuitry to suppress the signal prior to the time period.

5. The communications device of claim 4 wherein the reset circuitry includes a switch configured to short the node to a bias voltage in response to the control signal.

6. The communications device of claim 1 further comprising:
frequency detection circuitry coupled to the node;
wherein the frequency detection circuitry is configured to count the oscillations on the node.

7. The communications device of claim 1 wherein the control circuitry is configured to adjust the resonant frequency of the tunable filter circuitry in response to the resonant frequency differing from a desired frequency.

8. The communications device of claim 7 wherein the desired frequency includes an FM or AM broadcast frequency.

9. The communications device of claim 7 wherein the tunable filter circuitry includes an inductor in parallel with tunable capacitance circuitry.

10. The communications device of claim 9 wherein the control circuitry is configured to provide a control signal to the tunable capacitance circuitry to adjust the resonant frequency.

11. The communications device of claim 1 wherein the communication circuitry includes at least one of receiver circuitry configured to receive the signal across the node and transmitter circuitry configured to transmit the signal across the node.

12. A method performed by an integrated communications device, the method comprising:
storing energy in tunable filter circuitry in the device during a time period; and
determining the resonant frequency of the tunable filter circuitry from oscillations caused by the energy subsequent to the time period.

13. The method of claim 12 further comprising:
storing the energy in an inductor in the tunable filter circuitry.

14. The method of claim 12 further comprising:
storing the energy in tunable capacitance circuitry in the tunable filter circuitry.

15. The method of claim 12 further comprising:
suppressing signal received by the tunable filter circuitry prior to the time period.

16. The method of claim 12 further comprising:
comparing the oscillations to a clock signal to determine the resonant frequency.

17. The method of claim 12 further comprising:
adjusting the resonant frequency of the tunable filter circuitry in response to the resonant frequency differing from a desired frequency.

18. The method of claim 17 further comprising:
iteratively performing the adjusting, the storing, and the determining until the resonant frequency is equal to the desired frequency.

19. The method of claim 18 further comprising:
receiving a user input that identifies the desired frequency; and
iteratively performing the adjusting, the storing, and the determining until the resonant frequency is equal to the desired frequency in response to receiving the user input.

20. The method of claim 17 wherein the desired frequency includes an FM or AM broadcast frequency.

21. A communications system comprising:
a communications device including:
communications circuitry;
tunable filter circuitry including a node configured to pass a signal between an antenna and the communication circuitry; and
control circuitry configured to cause energy to be stored in the tunable filter circuitry for a time period and configured to determine a resonant frequency of the tunable filter circuitry from oscillations on the node caused by the energy subsequent to the time period;
an antenna coupled to the communications device; and
an input/output system configured to communicate with the communications device.

22. The communications system of claim 21 wherein the communication circuitry includes at least one of receiver circuitry configured to receive a first signal from the antenna and transmitter circuitry configured to transmit a second signal across the antenna.

23. The communications system of claim 21 wherein the control circuitry is configured to adjust the resonant frequency of the tunable filter circuitry in response to the resonant frequency differing from a desired frequency.

24. The communications system of claim 23 wherein the desired frequency includes an FM or AM broadcast frequency.

25. The communications system of claim 21 wherein the control circuitry is configured to iteratively adjust the resonant frequency, cause the energy to be stored in the tunable filter circuitry for the time period, and determine the resonant frequency of the tunable filter circuitry until the resonant frequency is equal to a desired frequency.

26. The communications system of claim 21 wherein the control circuitry is configured to cause a signal received by the antenna to be suppressed in the tunable filter circuitry prior to the time period.

* * * * *